US009698251B1

(12) United States Patent
Cheng et al.

(10) Patent No.: US 9,698,251 B1
(45) Date of Patent: Jul. 4, 2017

(54) FIN REVEAL LAST FOR FINFET

(71) Applicant: International Business Machines Corporation, Armonk, NY (US)

(72) Inventors: Kangguo Cheng, Schenectady, NY (US); Xin Miao, Guilderland, NY (US); Wenyu Xu, Albany, VT (US); Chen Zhang, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/276,349

(22) Filed: Sep. 26, 2016

(51) Int. Cl.
*H01L 29/66* (2006.01)
*H01L 21/28* (2006.01)

(52) U.S. Cl.
CPC .. *H01L 29/66795* (2013.01); *H01L 21/28008* (2013.01); *H01L 21/28123* (2013.01); *H01L 29/6656* (2013.01); *H01L 29/66545* (2013.01)

(58) Field of Classification Search
CPC ................... H01L 29/66545; H01L 29/66553
See application file for complete search history.

(56) References Cited

U.S. PATENT DOCUMENTS

| 7,923,337 | B2 | 4/2011 | Chang et al. |
| 8,557,666 | B2 | 10/2013 | Wei et al. |
| 8,912,606 | B2 | 12/2014 | Baldauf |
| 9,171,935 | B2 | 10/2015 | Kim et al. |
| 9,287,135 | B1 | 3/2016 | Doris et al. |
| 9,287,403 | B1 * | 3/2016 | Lee ..................... H01L 29/7851 |
| 2012/0313170 | A1 | 12/2012 | Chang et al. |
| 2013/0065371 | A1 | 3/2013 | Wei et al. |
| 2013/0277746 | A1 | 10/2013 | Baldauf et al. |
| 2014/0154854 | A1 | 6/2014 | Wei et al. |
| 2014/0239395 | A1 * | 8/2014 | Basker .............. H01L 29/66795 257/347 |
| 2015/0255569 | A1 | 9/2015 | Kim et al. |

* cited by examiner

*Primary Examiner* — Thomas L Dickey
(74) *Attorney, Agent, or Firm* — Cantor Colburn LLP; Vazken Alexanian

(57) ABSTRACT

A finfet reveal process is provided. The finfet reveal process includes forming a fin on a substrate, sequentially depositing first and second insulation layers over the fin and the substrate, and forming a dummy gate over the second insulation layer. The finfet reveal process further includes disposing spacers on either side of the dummy gate to expose the dummy gate and exposing opposite ends of the fin for insulated contact growth thereon to thereby re-form the first and second insulation layers into a pillar. In addition, the finfet reveal process also includes removing the dummy gate from between the spacers and sequentially removing the second insulation layer and then the first insulation layer from the pillar such that remainders of the pillar and the spacers form two-part spacers.

17 Claims, 7 Drawing Sheets

FIN REVEAL LAST FOR FINFET

BACKGROUND

The present invention relates to semiconductor devices and, more specifically, to a fin reveal for a last stage in a fin field effect transistor (finfet) process flow.

A replacement gate process, which is also known as a gate last process, avoids the problems of work function material stability seen in a gate first process. A dummy gate is formed and used to self-align the source and drain implants and anneals. Near the end of the process flow, the dummy gate materials are stripped out and replaced with high-k and metal gate materials.

SUMMARY

According to a non-limiting embodiment, a finfet reveal process is provided. The finfet reveal process includes forming a fin on a substrate, sequentially depositing first and second insulation layers over the fin and the substrate and forming a dummy gate over the second insulation layer. The finfet reveal process further includes disposing spacers on either side of the dummy gate to expose the dummy gate and exposing opposite ends of the fin for insulated contact growth thereon to thereby re-form the first and second insulation layers into a pillar. In addition, the finfet reveal process includes removing the dummy gate from between the spacers and sequentially removing the second insulation layer and then the first insulation layer from the pillar such that remainders of the pillar and the spacers form two-part spacers.

According to another non-limiting embodiment, a finfet reveal process is provided. The finfet reveal process includes forming first and second fins on a substrate in a parallel formation, sequentially depositing first and second insulation layers over the first and second fins and the substrate and forming a dummy gate over the second insulation layer. The finfet process further includes disposing spacers on either side of the dummy gate to expose the dummy gate and exposing, outside of the dummy gate and the spacers, respective opposite ends of the first and second fins for insulated contact growth thereon to thereby re-form the first and second layers into a pillar. In addition, the finfet reveal process also includes removing the dummy gate from between the spacers and sequentially removing the second insulation layer and then the first insulation layer from the pillar such that remainders of the pillar and the spacers form two-part spacers.

According to yet another non-limiting embodiment, a finfet reveal process structure is provided. The finfet reveal process structure includes a substrate with one or more fins formed thereon, first and second insulation layers and spacers. The first and second insulation layers are sequentially deposited over the one or more fins and the substrate. A central portion of the first and second insulation layers are disposed to form lower spacer portions surrounding and transversely oriented relative to corresponding portions of each of the one or more fins. The spacers are disposed to extend upwardly from the lower spacer portions to respectively form with the lower-spacer portions two-part spacers. The two-part spacers are disposed to define a gate formation support region therebetween.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other features of the invention are apparent from the following detailed description taken in conjunction with non-limiting embodiments illustrated in the accompanying drawings. In particular, FIGS. 1-13 are a series of views illustrating a fin reveal for a last stage in a fin field effect transistor (finfet) process flow according to exemplary embodiments of the present teachings, in which:

FIG. 1 is a perspective view of a semiconductor substrate with first and second fins in accordance with one or more embodiments;

FIG. 2 is a perspective view of the semiconductor substrate of FIG. 1 with first and second insulation layers deposited thereon in accordance with one or more embodiments;

FIG. 3 is a perspective view of the semiconductor substrate and the insulation layers of FIGS. 1 and 2 with an amorphous silicon layer and a hardmask deposited thereon in accordance with one or more embodiments;

FIG. 4 is a perspective view of the amorphous silicon layer and the hardmask of FIG. 3 formed into a dummy gate in accordance with one or more embodiments;

FIG. 5 is a perspective view of a spacer layer deposited over the dummy gate and the second insulation layer of FIGS. 4 and 2, respectively, in accordance with one or more embodiments;

FIG. 6 is a perspective view of a spacer layer deposited over the dummy gate and the second insulation layer of FIGS. 4 and 2, respectively, in accordance with one or more embodiments;

FIG. 7 is a perspective view of the spacer layer of FIG. 6 opened up to reveal the dummy gate between resulting spacers and portions of the first and second fins and the first and second insulation layers removed in accordance with one or more embodiments;

FIG. 8 is a perspective view of epitaxially grown contacts in contact with remaining portions of the first and second fins in accordance with one or more embodiments;

FIG. 9 is a perspective view of interlayer dielectric deposited over the epitaxially grown contacts of FIG. 8 in accordance with one or more embodiments;

FIG. 10 is a perspective view of the dummy gate removed from between the spacers of FIG. 7 in accordance with one or more embodiments;

FIG. 11 is a perspective view of a central portion of the second insulation layer removed below a cavity left behind by the removal of the dummy gate of FIG. 10 in accordance with one or more embodiments;

FIG. 12 is a perspective view of a central portion of the first insulation layer removed below the cavity left behind by the removal of the dummy gate of FIG. 10 in accordance with one or more embodiments; and FIG. 13 is a perspective view of a finfet device formed in the cavities left behind by the removal of the dummy gate of FIG. 10 and the central portions of the first and second insulation layers of FIGS. 11 and 12, respectively, in accordance with one or more embodiments.

DETAILED DESCRIPTION

Figure 1:
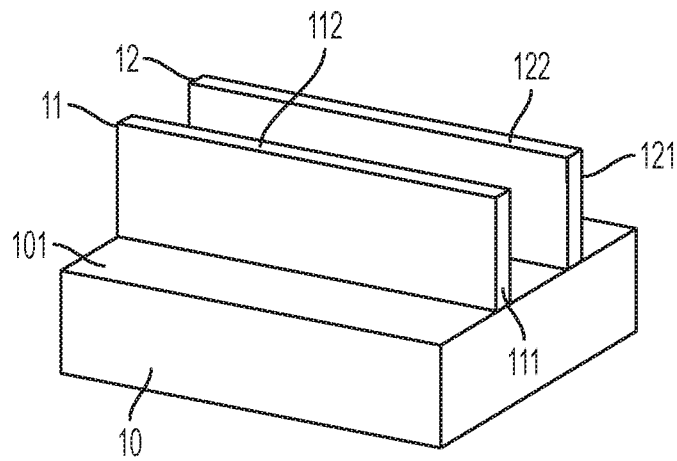

Various embodiments of the present invention are described herein with reference to the related drawings.

Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present invention to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The term "exemplary" is used herein to mean "serving as an example, instance, or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

For the sake of brevity, conventional techniques related to semiconductor device and IC fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the present description utilizes a variety of individually known physical and chemical processes performed on a semiconductor (e.g., silicon) substrate. In general, the various processes used to form a micro-chip that will be packaged into an IC fall into three categories, namely, film deposition, patterning, etching and semiconductor doping. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to all of the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of specific technologies relevant to embodiments of the present invention, in current gate last finfet process flows, it is often the case that vertical amorphous silicon (a-Si) dummy gates need to be formed but that such formation can be difficult or problematic. As such features are scaled down to the ~7 nm range, the gap between two adjacent gates becomes similarly scaled down. This makes it increasingly difficult to etch vertical dummy a-Si gates from the top of the fin to the bottom of the fin. Another issue is that a high aspect ratio of the gate being formed can lead to gate bending.

Turning now to an overview of aspects of the present invention, embodiments provide a new type of spacer and a correspondingly new process flow with the results that etching a-Si between fins is no longer required and that full spacer pull-down on fin side walls is bypassed. These results and others are provided by a reveal of the fin separately from other structures. That is, at one stage, one fin reveal happens after formation of a dummy gate and, at another stage, another fin reveal happens when the dummy gate is pulled. In this way, the material to etch between fins is different from the bulk of the dummy gate material which greatly enlarges the process window. In addition, the spacer pull-down from the fin side wall is bypassed so that the height of the gate hard mask can be reduced which will decrease the gate aspect ratio.

Turning now to a more detailed description of embodiments of the present invention, FIG. 1 depicts a substrate 10. A first fin 11 and a second fin 12 are disposed on the substrate 10. The first and second fins 11 and 12 are substantially parallel with one another and have similar widths, heights and lengths. As shown in FIG. 1, the heights of the first and second fins 11 and 12 exceed their widths and the lengths of the first and second fins 11 and 12 exceed their heights. The substrate 10, the first fin 11 and the second fin 12 can each be formed of similar or different semiconductor materials including, but not limited to, silicon (Si), germanium (Ge), gallium arsenide (GaAs), alloys of silicon and germanium or indium phosphide (InP).

A distance between the first and second fins 11 and 12 can be between 10-50 nm but can also be scaled down to distances of ~7-10 nm or less.

Figure 2:
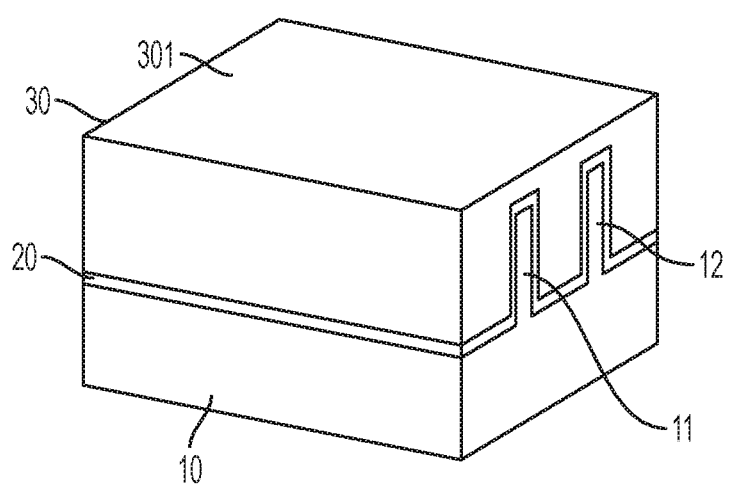

With reference to FIG. 2, first and second insulation layers 20 and 30 are provided over the substrate 10 and the first and second fins 11 and 12. In detail, the first insulation layer 20 is deposited over an uppermost surface 101 of the substrate 10 exposed by the first and second fins 11 and 12 (see FIG. 1), respective sidewalls 111 and 121 of the first and second fins 11 and 12 (see FIG. 1) and respective uppermost surfaces 112 and 122 of the first and second fins 11 and 12 (see FIG. 1). The second insulation layer 30 is filled or deposited over the first insulation layer 20 and has a planarized uppermost surface 301 which has a height exceeding the combined heights of the first and second fins 11 and 12 and the first insulation layer 20. The planarization of the uppermost surface 301 can be achieved by chemical mechanical polishing or another similar process.

The first insulation layer 20 can be formed of nitride, such as silicon nitride or another similar material. The second insulation layer 30 can be formed of shallow trench isolation (STI) material, such as an oxide.

Figure 3:
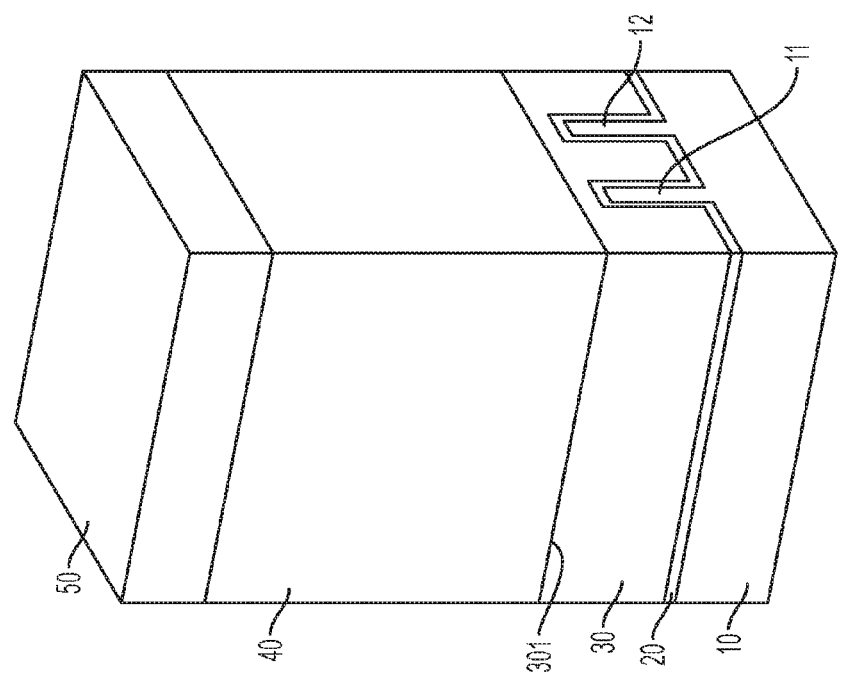

With reference to FIG. 3, an amorphous silicon (a-Si) layer 40 is deposited over the uppermost surface 301 of the second insulation layer 30 and a hardmask 50 is formed by deposition over an uppermost surface 401 of the a-Si layer 40. The amorphous silicon of the a-Si layer 40 is a non-crystalline form of silicon and can be deposited by various processes including, but not limited to, chemical vapor deposition (CVD), plasma enhanced CVD (PECVD), catalytic CVD and sputtering. The hardmask 50 can be formed of nitride, such as silicon nitride or another similar material.

Figure 4:
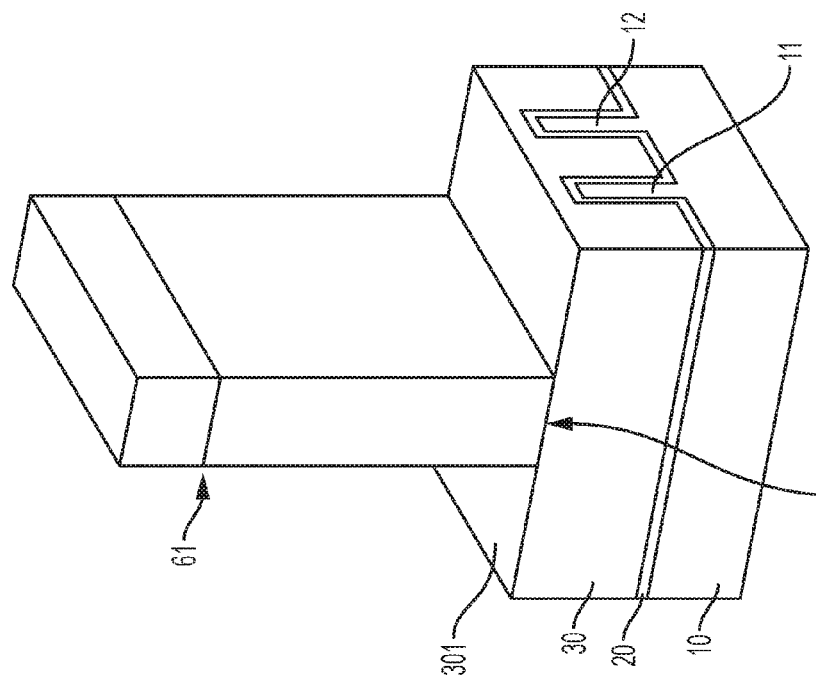

With reference to FIG. 4, the a-Si layer 40 and the hardmask 50 are formed into a dummy gate 61 of a resulting dummy gate structure 60 by one or more of dry etching, such as anisotropic reactive ion etching (RIE), lithography and side image transfer (SIT) processing. In any case, the dummy gate structure 60 includes the first and second fins 11 and 12 disposed as described above on the substrate 10 in the parallel formation, the first insulation layer 20 deposited as described above over the first and second fins 11 and 12 and the substrate 10, the second insulation layer 30 deposited as described above over the first insulation layer 20 and a dummy gate 61. The dummy gate 61 is thus formed over a portion 62 of the uppermost surface 301 of the second insulation layer 30 to extend in a direction which is oriented transversely relative to the respective planes of the first and second fins 11 and 12. That is, the dummy gate 61 can be formed to extend perpendicularly relative to the first and second fins 11 and 12.

A width of the dummy gate 61 can be on the order of 10-50 nm but can be scaled down to widths of ~7-10 nm or less.

Figure 5:
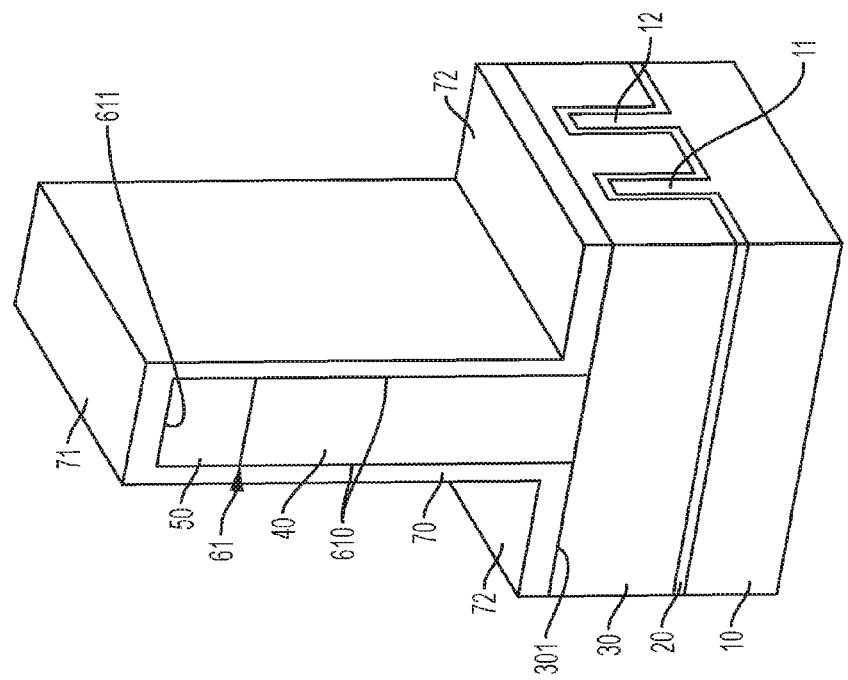

With reference to FIG. 5, low-k or ultra low-k (ULK) spacer material layer 70 is deposited over the uppermost surface 301 of the second insulation layer 30, along the opposite sidewalls 610 of the dummy gate 61 and over an uppermost surface 611 of the dummy gate 61. The low-k or ULK spacer material layer 70 can include SiBCN and can be hard, thermally stable and amorphous or non-crystalline. The low-k or ULK spacer material layer 70 can be deposited by various processes including, but not limited to, chemical vapor deposition (CVD), plasma enhanced CVD (PECVD), catalytic CVD and sputtering.

Figure 6:
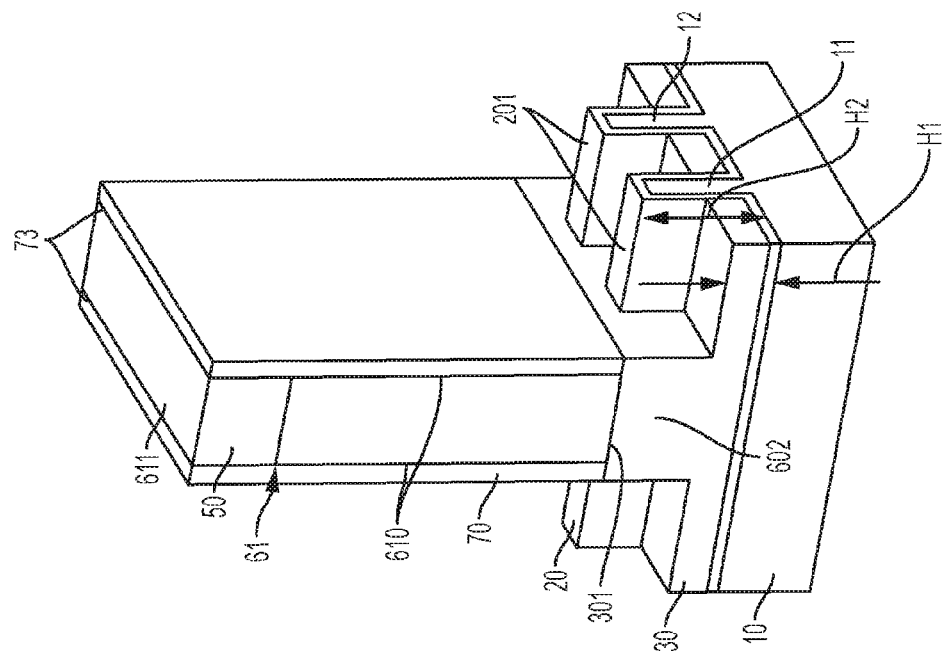

With reference to FIG. 6, the uppermost portion 71 (see FIG. 5) of the low-k or ULK spacer material layer 70 that extends over the uppermost surface 611 of the dummy gate 61 is removed. Such removal can be executed by a directional etch, for example, and thus exposes the dummy gate 61 and, more particularly, the hardmask 50. In addition, as shown in FIG. 6, upper portions of respective opposite ends of the first and second fins 11 and 12 and corresponding portions of the first insulation layer 20 are exposed. Such exposure can be conducted, for example, by a directional etch that removes the lowermost portions 72 (see FIG. 5) of the low-k or ULK spacer material layer 70 along with portions of the second insulation layer 30 while being selective to nitride such that the nitride material of the hardmask 50 and the nitride material of the first insulation layer 20 are each left intact.

The removal of the lowermost portions 72 of the low-k or ULK spacer material layer 70 results in the formation of spacers 73. As shown in FIG. 6, the spacers 73 extend upwardly from the uppermost surface 301 of the second insulation layer 30 and can be planarized with the now-exposed uppermost surface of the hardmask 50.

As is also shown in FIG. 6, the exposing of the respective opposite ends of the first and second fins 11 and 12 can further include initially recessing the portions of the second insulation layer 30 about the respective opposite ends of the first and second fins 11 and 12 to a target height H1. The target height H1 can be, but is not required to be, lower than the respective heights H2 of the first and second fins 11 and 12 and, when the target height H1 is lower than the respective heights H2 of the first and second fins 11 and 12, the respective opposite ends of the first and second fins 11 and 12 protrude above the newly formed upper surface of the second insulation layer 30.

Figure 7:
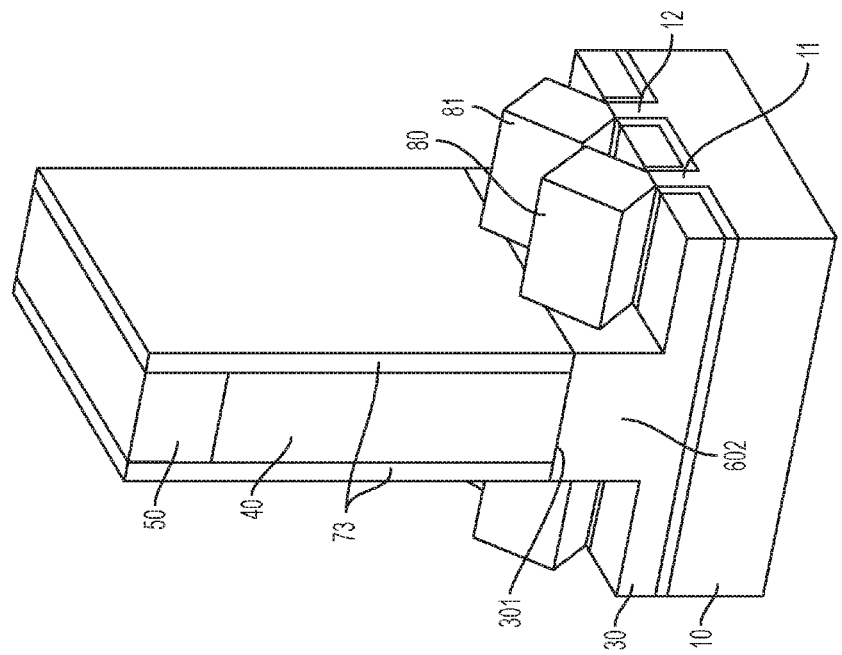

With reference to FIG. 7, the portions 201 (see FIG. 6) of the first insulation layer 20 deposited about the respective opposite ends of the first and second fins 11 and 12 are stripped by, for example, a wet or gas phase etch to expose the respective opposite ends of the first and second fins 11 and 12. At this point, respective portions of the respective opposite ends of the first and second fins 11 and 12 can be, but are not required to be, stripped to the target height H1. The stripping of the first and second fins 11 and 12 can be conducted by, for example, a dry etch or RIE with a potential result of the remaining portions 201 and 301 of the first and second insulation layers 20 and 30 are planarized with the respective remainders of the respective opposite ends of the first and second fins 11 and 12.

Although the recessing of the second insulation layer 30 of FIG. 6 and the subsequent stripping of the first insulation layer 20 and the first and second fins 11 and 12 of FIGS. 6 and 7 are described herein as being optional, for purposes of clarity and brevity the following description will relate only to the case in which the recessing and stripping have been executed to effectively re-form the first and second insulation layers 20 and 30 into a central pillar 602.

Figure 8:
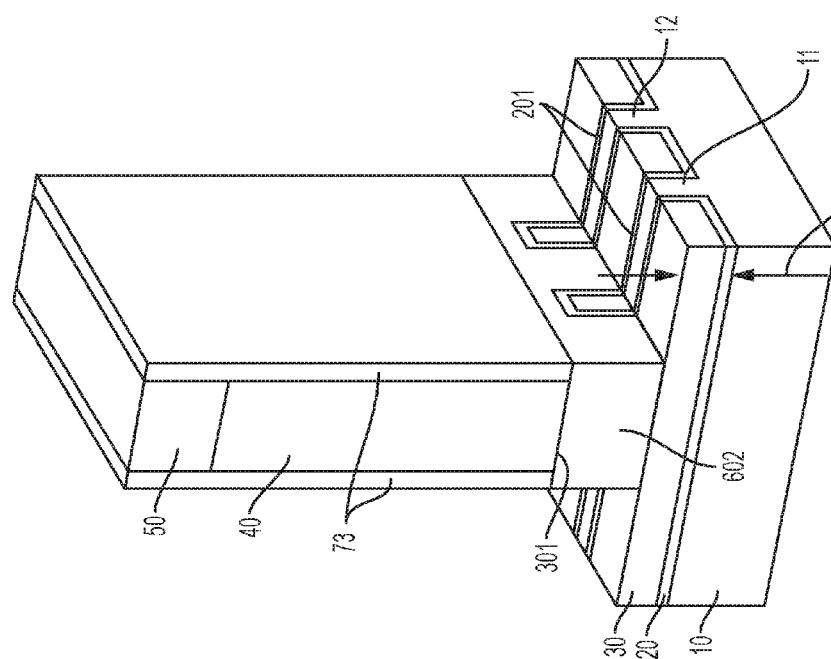

With reference to FIG. 8, first and second pairs of source and drain contacts 80 and 81 are epitaxially grown to be in contact with the respective remainders of the respective opposite ends of the first and second fins 11 and 12. The contacts 80 and 81 can be epitaxially grown from gaseous or liquid precursors with the first and second fins 11 and 12 acting as seed crystals and thus can be locked into one or more crystallographic orientations with respect to the first and second fins 11 and 12.

Figure 9:
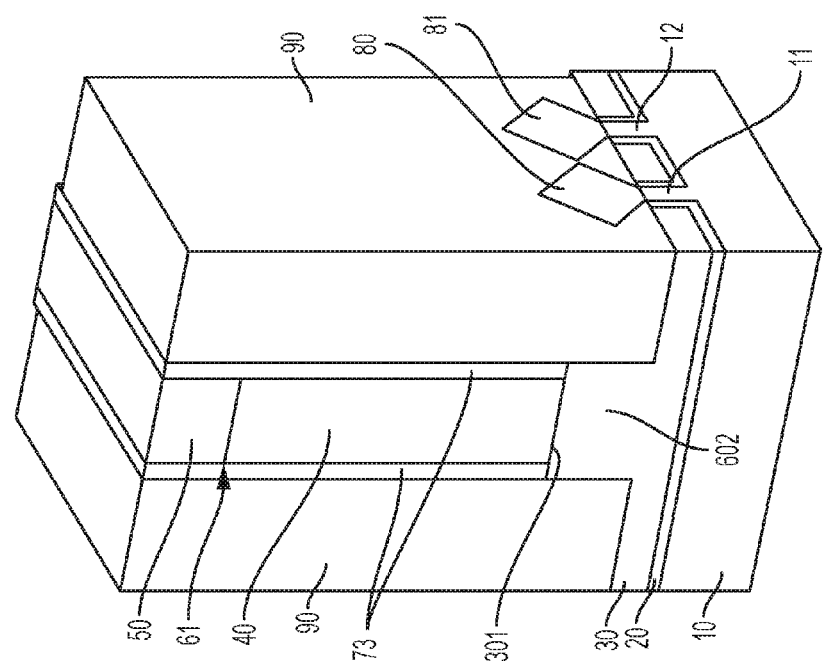

With reference to FIG. 9, interlayer dielectric (ILD) material 90 is deposited or filled around and over the contacts 80 and 81 and on the opposite sides of the spacers 73. The ILD material 90 can be formed of an oxide, for example, so as to be distinguished from the material of the hard mask 50 in subsequent etching processes. As shown in FIG. 9, the ILD material 90 can be planarized with the respective uppermost surfaces of the spacers 73 and the hardmask 50.

Figure 10:
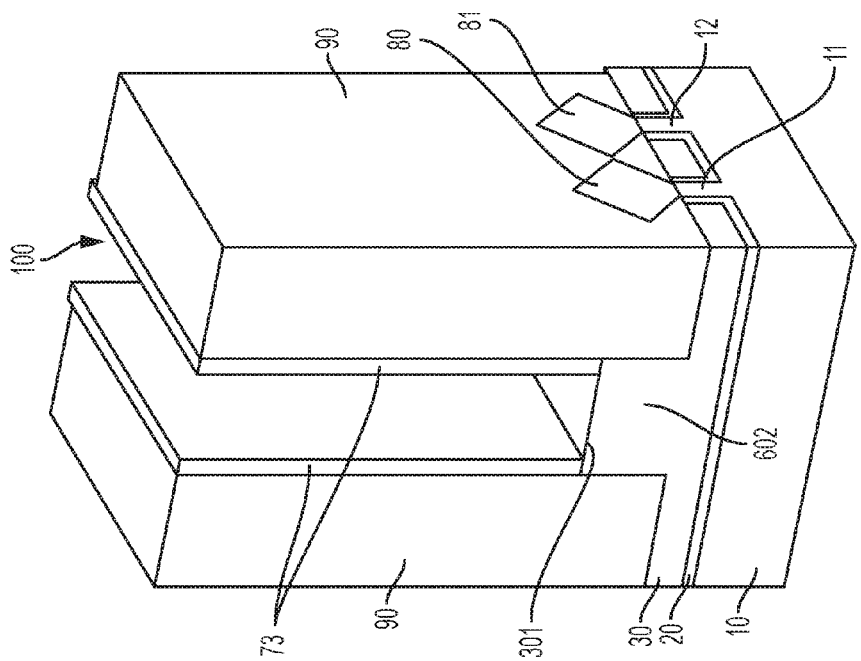

With reference to FIG. 10, once the ILD material 90 is deposited or filled as shown in FIG. 9, the dummy gate 61 is removed from between the spacers 73. Subsequently, a central portion of the second insulation layer 30 and a central portion of the first insulation layer 20 are sequentially removed from the pillar 602.

The removal of the dummy gate 61 can be conducted, for example, by a dry etch, RIE or by a wet etch that is selective to the oxide material of the ILD material 90 and the oxide material of the second insulation layer 30. Thus, the removal of the dummy gate 61 continues until the remaining central portion of the uppermost surface 301 of the central portion of the second insulation layer 30 in the pillar 602 is reached. The resulting overall structure thus defines a first cavity 100 between the spacers 73 and above the second insulation layer 30.

Figure 11:
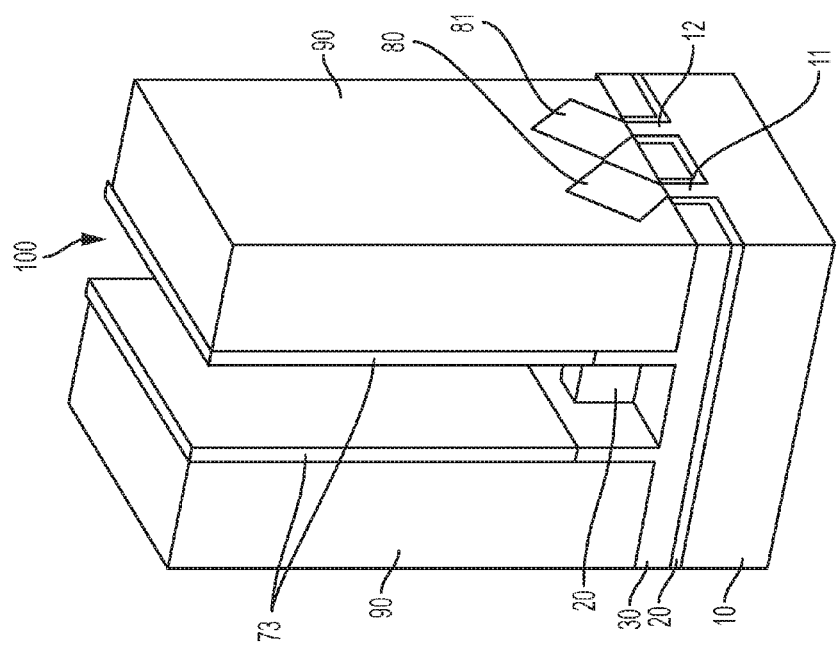

With reference to FIG. 11, the removal of the central portion of the second insulation layer 30 from the pillar 602 can be conducted below the first cavity 100, for example, by RIE and continues until a target height H3 is reached. The target height H3 can be, but is not required to be coplanar with the target height H1.

Figure 12:
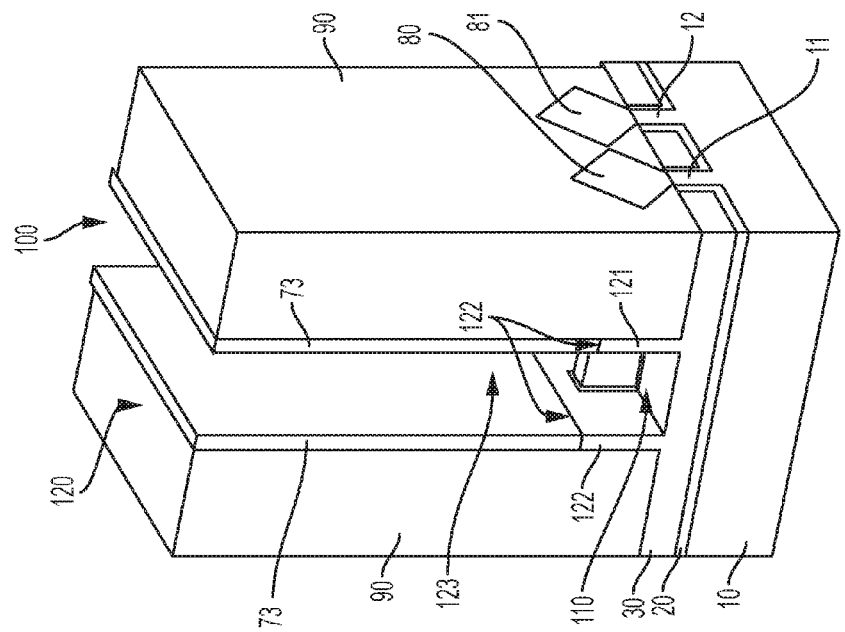

With reference to FIG. 12, the central portion of the first insulation layer 20 in the pillar 602 is stripped to complete the formation of a second cavity 110. The stripping can be conducted, for example, by a wet or gas phase etch that is selective to oxide and the low-k or ULK material of the spacers 73. The resulting structure 120 following the stripping of the central portion of the first insulation layer 20 effectively re-forms the pillar 602 into lower spacer portions 121 that respectively form, with the spacers 73, two-part spacers 122. The two-part spacers 122 thus bookend the first and second cavities 100 and 110 such that the first and second cavities define a gate formation support region 123 for use in a finfet reveal process.

Figure 13:
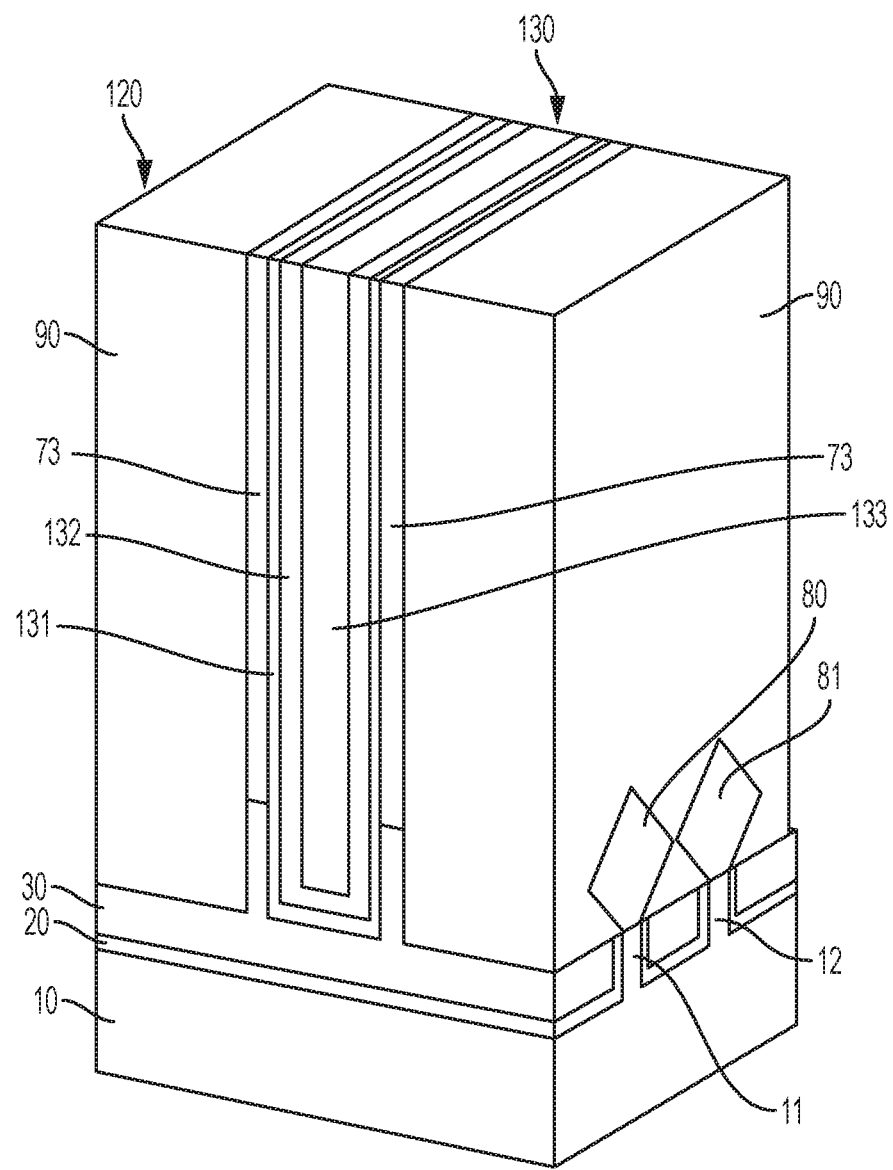

With reference to FIG. 13, the finfet reveal process further includes the formation of a finfet device 130 within the gate formation support region 123 (see FIG. 12). The finfet device 130 can be formed by various processes and includes a high-k electrode 131 disposed in contact with the first and second fins 11 and 12, work function metal 132 and a metallic gate 133.

Descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A finfet reveal process, comprising:
forming a fin on a substrate;
sequentially depositing first and second insulation layers over the fin and the substrate;
forming a dummy gate over the second insulation layer;
disposing, on either side of the dummy gate, spacers exposing the dummy gate;
exposing opposite ends of the fin for insulated contact growth thereon to thereby re-form the first and second insulation layers into a pillar, the exposing comprising recessing the second insulation layer about the opposite ends of the fin to a target height and stripping the first insulation layer about the opposite ends of the fin and portions of the opposite ends of the fin to the target height; and
removing the dummy gate from between the spacers and sequentially removing the second insulation layer and then the first insulation layer from the pillar such that remainders of the pillar and the spacers form two-part spacers.

2. The finfet reveal process according to claim 1, wherein the etching of the fin comprises etching first and second fins in a parallel formation on the substrate.

3. The finfet reveal process according to claim 1, wherein the first insulation layer comprises a nitride, the second insulation layer comprises an oxide and the spacers comprise low-k dielectric material.

4. The finfet reveal process according to claim 1, wherein the forming of the dummy gate comprises:
depositing amorphous silicon (a-Si) over the second insulation layer;
forming a hardmask over the a-Si; and
etching the a-Si and the hardmask into the dummy gate.

5. The finfet reveal process according to claim 1, wherein the disposing of the spacers comprises:
depositing low-k spacer material over the dummy gate and the second insulation layer;
removing the low-k spacer material extending over an uppermost surface of the dummy gate.

6. The finfet reveal process according to claim 1, further comprising:
epitaxially growing contacts at the exposed opposite ends of the fin; and
depositing interlayer dielectric (ILD) over the epitaxially grown contacts.

7. The finfet reveal process according to claim 1, further comprising building a finfet device in contact with the fin between the spacers.

8. The finfet reveal process according to claim 1, wherein the finfet device comprises a high-k electrode, work function metal and a metallic gate.

9. A finfet reveal process, comprising:
forming first and second fins on a substrate in a parallel formation;
sequentially depositing first and second insulation layers over the first and second fins and the substrate;
forming a dummy gate over the second insulation layer;
disposing, on either side of the dummy gate, spacers exposing the dummy gate;
exposing, outside of the dummy gate and the spacers, respective opposite ends of the first and second fins for insulated contact growth thereon to thereby re-form the first and second layers into a pillar, the exposing comprising recessing the second insulation layer about the respective opposite ends of the first and second fins to a target height and stripping the first insulation layer about the respective opposite ends of the first and second fins and portions of the respective opposite ends of the first and second fins to the target height; and
removing the dummy gate from between the spacers and sequentially removing the second insulation layer and then the first insulation layer from the pillar such that remainders of the pillar and the spacers form two-part spacers.

10. The finfet reveal process according to claim 9, wherein the first insulation layer comprises a nitride, the second insulation layer comprises an oxide and the spacers comprise low-k dielectric material.

11. The finfet reveal process according to claim 9, wherein the forming of the dummy gate comprises:
depositing amorphous silicon (a-Si) over the second insulation layer;
forming a hardmask over the a-Si; and
etching the a-Si and the hardmask into the dummy gate.

12. The finfet reveal process according to claim 9, wherein the disposing of the spacers comprises:
depositing low-k spacer material over the dummy gate and the second insulation layer; and
removing the low-k spacer material extending over an uppermost surface of the dummy gate.

13. The finfet reveal process according to claim 9, further comprising:
  epitaxially growing contacts at the exposed respective opposite ends of the first and second fins; and
  depositing interlayer dielectric (ILD) over the epitaxially grown contacts.

14. The finfet reveal process according to claim 9, further comprising building a finfet device in contact with the fin between the spacers.

15. The finfet reveal process according to claim 9, wherein the finfet device comprises a high-k electrode, work function metal and a metallic gate.

16. A finfet reveal process, comprising:
  forming a fin on a substrate;
  sequentially depositing first and second insulation layers over the fin and the substrate;
  forming a dummy gate over the second insulation layer;
  disposing, on either side of the dummy gate, spacers exposing the dummy gate;
  exposing opposite ends of the fin for insulated contact growth thereon to thereby re-form the first and second insulation layers into a pillar; and
  removing the dummy gate from between the spacers and sequentially removing the second insulation layer and then the first insulation layer from the pillar such that remainders of the pillar and the spacers form two-part spacers,
  wherein the sequential removing of the dummy gate and the first and second insulation layers comprises:
  etching the dummy gate to the second insulation layer;
  etching the second insulation layer to the first insulation layer to a target height; and
  stripping the first insulation layer to the target height.

17. A finfet reveal process, comprising:
  forming first and second fins on a substrate in a parallel formation;
  sequentially depositing first and second insulation layers over the first and second fins and the substrate;
  forming a dummy gate over the second insulation layer;
  disposing, on either side of the dummy gate, spacers exposing the dummy gate;
  exposing, outside of the dummy gate and the spacers, respective opposite ends of the first and second fins for insulated contact growth thereon to thereby re-form the first and second layers into a pillar, the exposing comprising recessing the second insulation layer about the respective opposite ends of the first and second fins to a target height and stripping the first insulation layer about the respective opposite ends of the first and second fins and portions of the respective opposite ends of the first and second fins to the target height; and
  removing the dummy gate from between the spacers and sequentially removing the second insulation layer and then the first insulation layer from the pillar such that remainders of the pillar and the spacers form two-part spacers,
  wherein the sequential removing of the dummy gate and the first and second insulation layers comprises:
  etching the dummy gate to the second insulation layer;
  etching the second insulation layer to the first insulation layer to a target height; and
  stripping the first insulation layer to the target height.

\* \* \* \* \*